United States Patent
Sarda

(10) Patent No.: US 10,712,390 B2
(45) Date of Patent: Jul. 14, 2020

(54) REGULATOR CONTROL DURING SCAN SHIFT AND CAPTURE CYCLES

(71) Applicant: Silicon Laboratories Inc., Austin, TX (US)

(72) Inventor: Vivek Sarda, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 79 days.

(21) Appl. No.: 15/713,178

(22) Filed: Sep. 22, 2017

(65) Prior Publication Data
US 2019/0094302 A1    Mar. 28, 2019

(51) Int. Cl.
| | | |
|---|---|---|
| G01R 31/3185 | (2006.01) | |
| G01R 31/319 | (2006.01) | |
| G05F 1/10 | (2006.01) | |

(52) U.S. Cl.
CPC .......... *G01R 31/318575* (2013.01); *G01R 31/31924* (2013.01); *G01R 31/318536* (2013.01); *G01R 31/318555* (2013.01); *G05F 1/10* (2013.01); *G01R 31/318552* (2013.01)

(58) Field of Classification Search
CPC ...... G01R 31/318575; G01R 31/31924; G01R 31/318536; G01R 31/31905; G01R 31/318544; G01R 31/318555; G05F 1/10
See application file for complete search history.

(56) References Cited

U.S. PATENT DOCUMENTS

| | | | | |
|---|---|---|---|---|
| 6,411,116 | B1* | 6/2002 | DeHaven | G01R 1/07314 324/762.01 |
| 9,824,773 | B1* | 11/2017 | Arabi | G06F 1/3275 |
| 2006/0282735 | A1* | 12/2006 | Weinraub | G01R 31/31905 714/742 |
| 2009/0113265 | A1* | 4/2009 | Cannon | G01R 31/31854 714/729 |
| 2010/0115475 | A1 | 5/2010 | Buonpane et al. | |
| 2016/0178695 | A1* | 6/2016 | Zhang | G01R 31/31855 714/727 |
| 2017/0030961 | A1 | 2/2017 | McCullough | |

* cited by examiner

*Primary Examiner* — Shelly A Chase
(74) *Attorney, Agent, or Firm* — Zagorin Cave LLP

(57) ABSTRACT

During scan testing a voltage regulator is programmed to supply a first voltage to logic under test during a shift portion of the scan test, a second voltage during a first portion of a capture portion of the scan test and at least a third voltage during a second portion of the capture portion of the scan test. The availability of a programmable voltage regulator during shift and capture portions of scan testing allows a less stressful voltage to be used during a shift portion of the scan test to reduce shift failures and allows various voltages to be used during capture portions of the scan testing as a surrogate for testing at different temperatures and to provide more flexibility in testing margins.

18 Claims, 3 Drawing Sheets

REGULATOR CONTROL DURING SCAN SHIFT AND CAPTURE CYCLES

BACKGROUND

Field of the Invention

This invention relates to scan testing and more particularly to controlling voltage during scan testing.

Description of the Related Art

Scan testing provides testing of stuck-at and dynamic faults in integrated circuits. Storage elements such as flip-flops are configured in one or more scan strings and a test pattern is serially shifted into the scan strings during a shift phase of the testing. The storage elements are then configured back into functional mode and the integrated circuit is operated at speed by providing one or more functional clocks during a capture phase of the testing. The storage elements are then configured back into a scan mode and the results of the at speed testing are shifted to an evaluation device, e.g., automatic test equipment (ATE), to determine if the test was successful.

FIG. 1 illustrates a simplified diagram of a portion of an integrated circuit illustrating how logic is configured for a shift portion of a scan test and a capture portion. While two flip-flops are shown for ease of illustration, each integrated circuit can have multiple scan strings with hundreds or thousands of storage elements in each scan string. In functional mode, flip-flop 101 supplies its output as an input to combinational logic 103, which in turn supplies flip flop 105 with an input signal 107 through multiplexer 109. The combinational logic 103 receives other inputs 111 and 115, e.g., from other flip-flops and/or other combinational logic. When a capture clock 117 is applied, flip-flop 105 clocks in the value on its input 107. In scan mode, with scan enable (SCANEN) asserted, the output of flip-flop 101 supplies the input of flip-flop 105 through multiplexer 109. Also in scan mode, the flip-flops receive a scan clock 119 rather than the capture clock 117. The scan clock 119 typically has a lower frequency than the capture clock 117. During the shift portion of the scan test, values are shifted into the flip-flops including the flip-flops 101 and 105. One or more capture clocks 117 are then applied. The logic then enters shift mode again and the results are shifted out to be evaluated by the ATE. The process is repeated until testing has provided sufficient test coverage to detect a desired percentage of defects.

Current integrated circuit testing techniques test critical path timing by testing the integrated circuit at different temperatures using automatic test equipment (ATE). Such testing requires multiple insertions of the device under test into an oven to provide testing at multiple temperatures. Critical path testing, debug, and failure analysis can be hampered by failures in the shift portion of scan test. Therefore, improvements in scan testing are desirable.

SUMMARY OF EMBODIMENTS OF THE INVENTION

Accordingly, in one embodiment an integrated circuit includes a first voltage regulator and a plurality of storage elements configurable into one or more scan chains. A first control circuit supplies the first voltage regulator a first value of a regulator control signal to cause the first voltage regulator to supply as a supply voltage a first voltage to the plurality of storage elements, during a shift portion of a scan test. The first control circuit supplies the first voltage regulator with a second value of the regulator control signal to cause the first voltage regulator to supply as the supply voltage a second voltage during a first portion of a capture portion of the scan test and the first control circuit is coupled to supply the first voltage regulator a third value of the regulator control signal to cause the first voltage regulator to supply as the supply voltage a third voltage during a second portion of the capture portion of the scan test.

In another embodiment, a method includes configuring a plurality of storage elements into one or more scan chains. The method further includes supplying the scan chain a first voltage as a supply voltage during a shift portion of a scan test and supplying the storage elements a second voltage as the supply voltage during a first portion of a capture portion of the scan test.

In another embodiment a method includes running a first capture portion of a first scan test of an integrated circuit with a supply voltage from a regulator on the integrated circuit supplying a first voltage that has been correlated to a first temperature; and running a second capture portion of a second scan test with the supply voltage from the voltage regulator at a second voltage that has been correlated to a second temperature.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Embodiments herein provide an ability to provide stress under test that can replace at least some temperature testing and eliminate the need for oven insertions during testing. Testing of critical path timing for good die during scan includes temperature testing using ATE. That typically requires an expensive multi-temperature (e.g., two or three) insertion process. In addition, temperature inversion effects in sub 65 nm processes can change the worst case temperature corner of the die. Further, identification and debug of marginal paths is difficult with a single VDD setup for scan. Potentially weak scan paths also provide an aging and defect analysis issue for returned parts in that weak scan paths may prevent satisfactory defect analysis.

To provide greater flexibility to avoid weak scan paths and to provide an alternative to temperature testing using multiple insertions, embodiments herein utilize a programmable regulator, e.g., a digital regulator, to adjust voltage during scan testing to simulate temperature testing and provide greater flexibility during testing. Having the ability to adjust the regulator and thereby adjust the voltage allows for reducing stress in the shift portion of a scan test. Thus, the capture portions can occur at one or multiple voltages while shift occurs at a different voltage that reduces stress of the shift. Thus, e.g., the shift portion can occur at a higher voltage than the voltage used during capture portion of the scan test. Such an approach can improve yield, provide a better understanding of die margin, and increase debug capability by reducing likelihood of weak scan timing paths resulting in failure.

Embodiments herein include a circuit to control regulator voltage during shift and capture portions of scan test to help with stressing capture, grading dies, and identifying faults (and identifying possible critical path improvements for later). That also allows temperature testing to be reduced or eliminated. In an embodiment, the regulator setting is correlated with temperature tested die before the temperature test is eliminated. That is, a supply voltage setting is correlated by determining supply voltage values that correlate to particular temperatures. In that way, rather than moving temperature, the voltage can be adjusted as a surrogate for temperature testing. Extra margin in paths can be identified for future use by evaluating multiple supply voltages for functional testing (capture portions of the scan test) either as products or as more efficient designs. Fault grading and speed grading can be done efficiently with one pattern and a different header file. The header file is a portion of the test vector scanned into storage locations (e.g. flip-flops) in the integrated circuit that contains information indicating the voltage regulator setting during the capture and scan portions of the scan testing.

Figure 1:
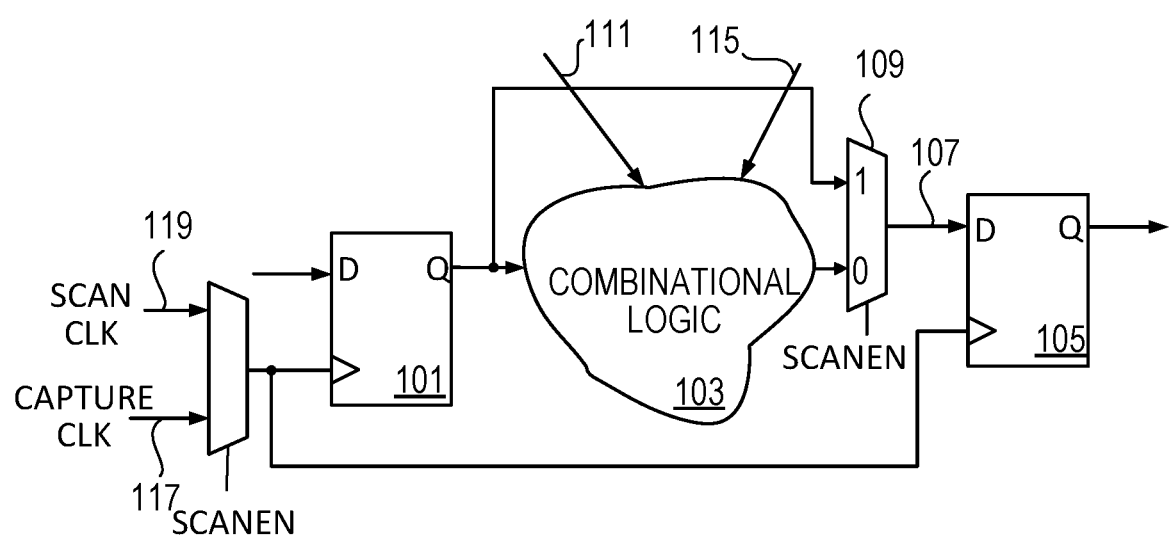
FIG. 1 illustrates how logic is configured for a shift portion of a scan test and a capture portion of the scan test.
Figure 2:
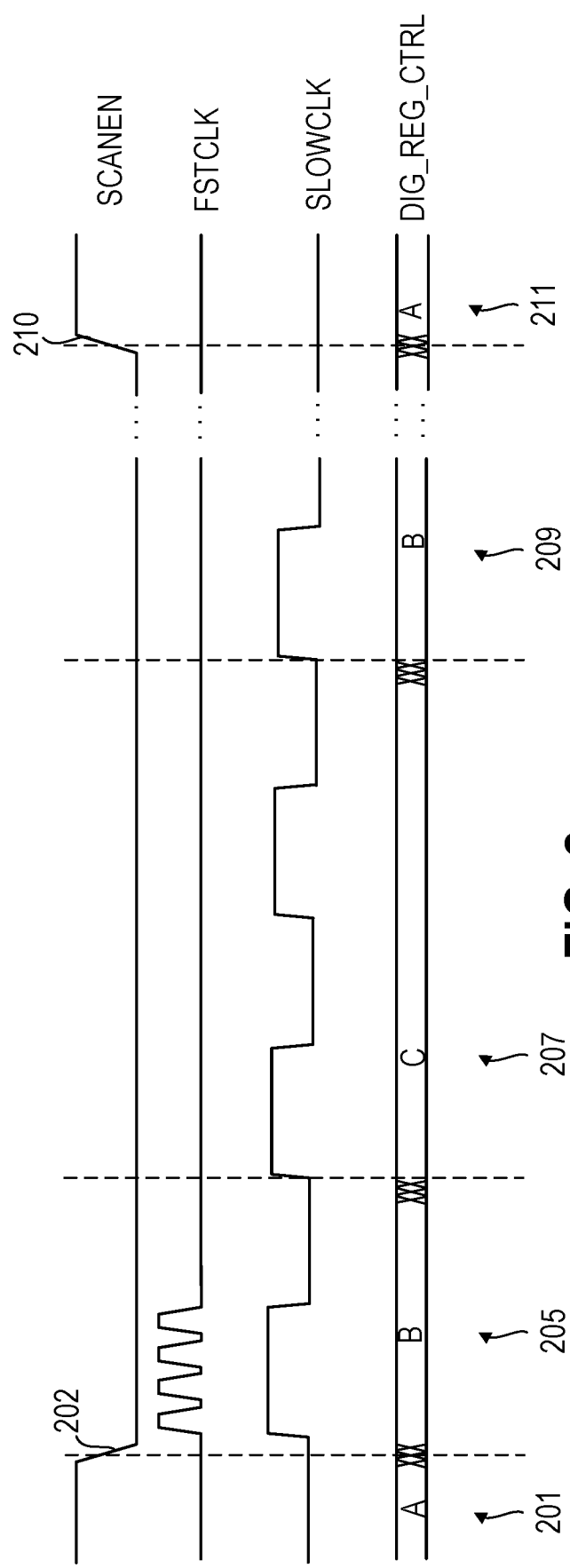
FIG. 2 illustrates a timing diagram showing how different voltages are supplied during shift and capture portions of the scan test.
Figure 3:
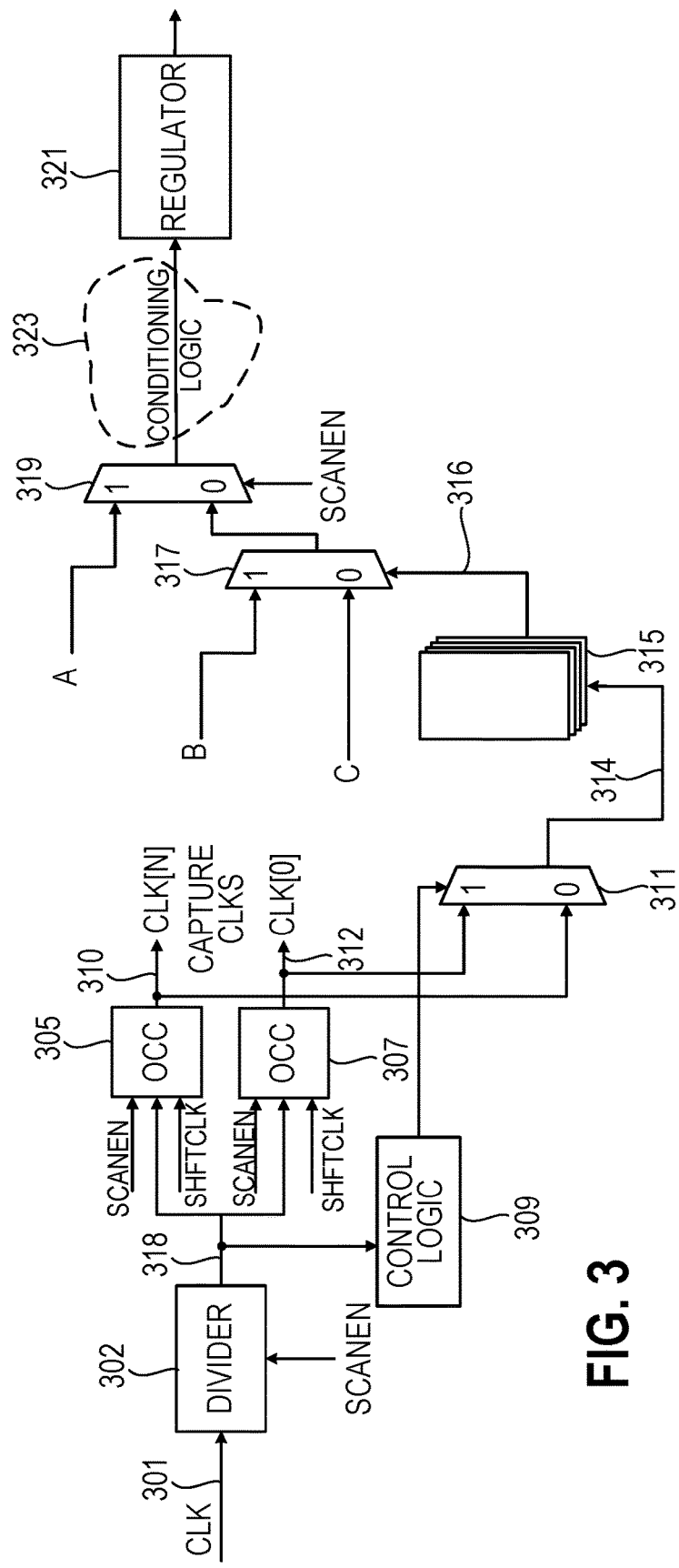
FIG. 3 illustrates a block diagram of a system providing different voltages during shift and capture portions of a scan test by controlling a voltage regulator providing the supply voltage on a cycle-by-cycle basis.

FIGS. 2 and 3 illustrate an embodiment showing an example timing diagram (FIG. 2) of shift and capture portions of a scan operation and a block diagram (FIG. 3) of a system that provides regulator control during the shift and capture portion of the scan testing. Referring to FIG. 2, during the shift portion 201 of the scan operation, which ends at 202, the digital regulator receives a control signal "A" and supplies the A voltage. In the example of FIG. 2, the capture portion uses two regulator settings, B and C. The capture operation includes functional clock pulses from a fast capture clock (FSTCLK) and a slow capture clock (SLOWCLK) having a lower frequency than FSTCLK. Other embodiments may include additional capture clocks with different frequencies. In the illustrated example, the slow clock is one eighth the frequency of the fast clock. In embodiments, the system controls the regulator for each period of one of the functional clocks (FSTCLK or SLOWCLK). In the example of FIG. 2, the control logic described further herein controls the voltage for each period of the SLOWCLK. In the illustrated embodiment, a regulator control setting of B results in a voltage B, a regulator control setting of C results in a voltage C, and a regulator control setting of A results in a voltage A. During the first portion 205 of the capture operation, which is the first period of the SLOWCLK, and also has four active periods of the FSTCLK, the digital regulator receives the digital control signal B and generates a voltage B. During the next two periods of the SLOWCLK shown as 207, the voltage regulator receives the digital control signal C generates a voltage C. The voltage regulator then returns to voltage B in 209 for the fourth period of the SLOWCLK. Thus, control logic supplies the voltage regulator pattern of B, C, C, B for respective periods of the SLOWCLK shown in FIG. 2. As explained more fully with relation to FIG. 3, the cycle-by-cycle control can also be provided for the FSTCLK.

When the shift portion resumes as indicated by the rising scan enable signal (SCAN_EN) at 210 the voltage supplied by the voltage regulator returns to voltage A in 211 to shift out the results of the capture portion. The voltage A is higher than voltages B or C and the higher voltage reduces the chances that the scan path will fail because of critical path timing issues in the scan path thereby allowing testing and/or debug to continue.

FIG. 3 illustrates an example block diagram of a system associated with the waveforms shown in FIG. 2. An input clock signal 301 supplies optional divider 302. The divider in turn supplies a clock signal to on-chip clock control (OCC) circuits 305 and 307. The OCCs 305 and 307 select between the shift clock (SHFTCLK) and the capture clock based on the scan enable (SCANEN) signal. The SCANEN signal, when asserted, indicates a shift operation and when deasserted the OCCs provide a functional clock. OCC 305 provides CLK[N] 310 and OCC 307 provides CLK[0] 312, which function as scan clocks or functional clocks depending on the value of SCANEN. The OCC's provide a divide function to supply clocks CLK[N] and CLK[0], when configured as functional clocks, with an appropriate frequency. Thus, OCC 305 divides the output 318 of divider 302 and OCC 307 divides the output 318 with different divide values to generate clock signals with different frequencies. In an embodiment CLK[N] corresponds to the FSTCLK of FIG. 2 and CLK[0] corresponds to the SLOWCLK of FIG. 2.

The control logic to provide the voltage regulator control includes control logic 309, which supplies the select signal to multiplexer 311 to select between the CLK[N] 310 and CLK[0] 312. That selection relates to which clock receives cycle-by-cycle regulator control. If CLK[0] receives cycle-by-cycle voltage regulator control, control logic 309 selects "1" such that selector circuit 311 supplies CLK0 to logic 315. The cycle-by-cycle control allows the voltage regulator to change voltages during each cycle of the selected clock. Other embodiments may provide less than cycle-by-cycle control. Such embodiments may be less complex in design but provide less testing flexibility. The control logic 309 may be implemented as a flip-flop having a value determined by the test vector scanned in during the shift cycle. Additional control logic to provide cycle-by-cycle voltage regulator control includes multiplexers 317 and 319. The output of the multiplexer 311 supplies logic 315. Logic 315 supplies a select signal 316 to multiplexer 317, which selects between regulator control signals B and C.

Logic 315 stores the cycle-by-cycle regulator control signal values. Logic 315 supplies the pattern to control the regulator 321. The voltage regulator supplies the logic under test with a supply voltage corresponding to the voltage regulator control signal. The logic under test includes the storage elements configurable into scan strings and logic coupled thereto. During the shift portion 201 (see FIG. 2), the logic 315 receives the regulator pattern, e.g., B, C, C, B. Operationally, logic 315 supplies those values to multiplexer 317 sequentially as shown, e.g., in FIG. 2. The voltage regulator control signal should be supplied to the regulator such that the regulator voltage supplied is stable before the active edge (rising edge) of the clock, here the SLOWCLK. In other embodiments, the falling edge may be the active edge of the clock.

Figure 4:
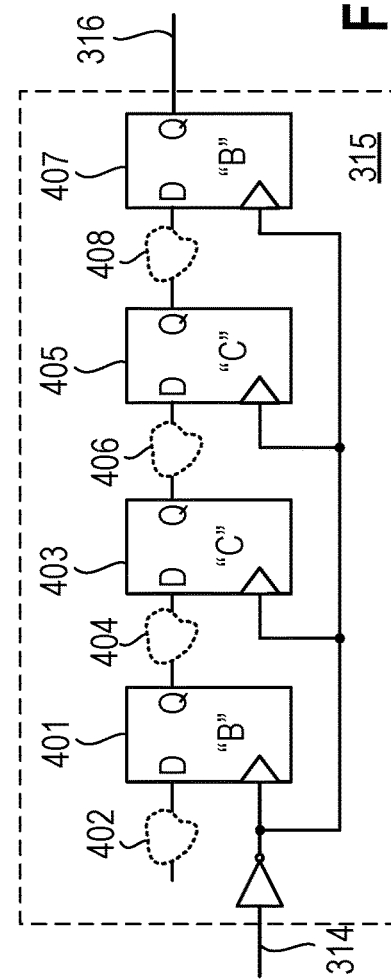
FIG. 4 illustrates an example storage configuration for the voltage regulator control signal pattern for the capture portion of the scan test.

Referring to FIGS. 2 and 3, the regulator control signals A, B, and C of FIG. 3 correspond to the regulator control signals A, B, and C shown in FIG. 2. At the deassertion of scan enable at 210, the control logic 315 selects B such that the regulator is stable before the first rising edge of the SLOWCLK. There is a time period between the falling edge of SCANEN and the rising edges of SLOWCLK and FST-CLK sufficient for voltage B to become stable. While FIG. 2 shows the selection of the regulator control signal for time periods 207 and 209 being made just prior to the rising edge of SLOWCLK, FIG. 4 illustrates an embodiment in which the voltage control signal changes on the falling edge of the SLOWCLK signal to give time for the voltage from regulator 321 to stabilize before the next functional clock edge. FIG. 4 illustrates an embodiment of logic 315 that includes four serially connected flip-flops 401, 403, 405, and 407, which are initialized during the shift portion of a scan test to store a multiplexer select pattern of 1, 0, 0, 1 corresponding to the regulator control signal pattern of B, C, C, B. The flip-flops are clocked during the capture portion of the scan test with an inverted clock signal 314 supplied by multiplexer 311. The serially connected flip-flops generate the desired multiplexer select pattern providing sufficient time for the regulator voltage to be stable prior to the edge of the capture clock. Additional flip-flops and/or additional logic gates may be used in logic 315 to achieve the desired regulator pattern. For example, logic 402, 404, 406, and 408 may be utilized to allow independent control of each stage of the shifted data for various test purposes. Thus, e.g., a test interface such as JTAG or a another serial interface may be coupled to the logic 402, 404, 406, and 408 to allow desired values to be forced into each of the registers.

In other embodiments, which provide more regulator control settings during the capture phase than just B and C, multiplexer 317 may have additional inputs or there may be additional multiplexers to select between the additional control settings. Control settings A, B, and C may be stored in storage locations loaded during the shift operation. In an embodiment the storage locations are separate from the logic being tested (loaded by a mechanism other than scan) and are programmable to allow various voltage settings to be written to the storage locations. In an embodiment, control logic 309 and 315 are combined to implement the voltage regulator control selection shown in FIGS. 2 and 3 using a state machine. For example, the state machine utilizing clock signal 318 may ensure use of the B voltage during the first clock period of the slow clock, the C voltage setting for the second and third clock periods, and the B voltage setting for the remaining clock period.

While FIG. 2 shows cycle by cycle control for the SLOWCLK, the same control can also be provided for the FSTCLK. In that case, control logic 309 selects the "0" input of multiplexer 311 and the logic 315 receives CLK[N] so that the regulator control updates at the speed of the CLK[N] and multiplexer 317 selects the desired regulator control signal in accordance with select signal 316.

Multiplexer 319 selects between the A scan voltage regulator setting and the capture voltage regulator setting supplied by multiplexer 317. To help avoid scan path failures, the A regulator setting can be used to cause the regulator 321 to supply a higher voltage than the regulator settings B and C during the capture portion of the cycle. In embodiments, conditioning logic 323 ensures the transition between voltage settings occurs without affecting the integrity of the capture testing. Thus, the conditioning logic may include, e.g., delay circuits and feedback, using techniques such as current injection and switched capacitors to ensure that switching the voltage regulator setting does not cause overshoot or otherwise impact the integrity of the capture testing. Other embodiments may not need conditioning logic if the change between regulator settings is guaranteed to not affect the integrity of the capture portion of the scan test.

Referring again to FIG. 2, regulator settings B and C may be provided during portions 205, 207, and 209 of the capture cycle. Other regulator settings may be provided during other scan tests. Providing VDD control through the regulator setting for each capture cycle or portion of capture cycle helps identify weak paths. For example, if the capture cycle was successful at particular voltage, more stressful voltage settings can be used to see where the limits of the design exist. Further, if a shift fails, the shift supply voltage can be increased to try and overcome the weak scan chain failure using a less stressful supply voltage. Thus, providing VDD control during the shifting allows more likely continuation of scan test without being compromised by weak scan paths.

In addition, controlling the regulator settings can provide a surrogate for temperature testing. Thus, lowering the voltage during capture cycles can simulate temperature insertions and avoid the costly temperature insertions otherwise required for full testing. Once voltage settings are correlated to temperature insertions, the insertions can be omitted and the critical timing stress at multiple temperatures tested by varying the regulator settings.

Thus, various aspects have been described relating to controlling the voltage regulator during scan shift and capture cycles. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. An integrated circuit comprising:
   a first voltage regulator;
   a plurality of storage elements configurable into one or more scan chains;
   a first control circuit configured to supply the first voltage regulator a first value of a regulator control signal to cause the first voltage regulator to supply as a supply voltage a first voltage to the plurality of storage elements during a shift portion of a scan test;
   wherein the first control circuit is configured to supply the first voltage regulator a second value of the regulator control signal to cause the first voltage regulator to supply as the supply voltage to the plurality of storage elements a second voltage during a first portion of a capture portion of the scan test and the first control circuit is configured to supply the first voltage regulator a third value of the regulator control signal to cause the first voltage regulator to supply as the supply voltage a third voltage during a second portion of the capture portion of the scan test;
   a first plurality of the plurality of storage elements configured to receive a first clock signal;
   a second plurality of the plurality of storage elements configured to receive a second clock signal; and
   wherein the first control circuit is configured to control the supply voltage to be the second voltage for at least one clock cycle of the first clock signal and to be the third voltage for another clock cycle of the first clock signal during the capture portion of the scan test.

2. The integrated circuit as recited in claim 1, wherein the first voltage is a higher voltage than the second voltage and the third voltage.

3. The integrated circuit as recited in claim 1, wherein the first control circuit is configured to allow the supply voltage to be varied for each cycle of the first clock signal.

4. The integrated circuit as recited in claim 3, wherein the second value is supplied during the at least one clock cycle of the first clock signal and the third value is supplied during the other clock cycle of the first clock signal.

5. An integrated circuit comprising:
a first voltage regulator;
a plurality of storage elements configurable into one or more scan chains;
a first control circuit configured to supply the first voltage regulator a first value of a regulator control signal to cause the first voltage regulator to supply as a supply voltage a first voltage to the plurality of storage elements during a shift portion of a scan test;
wherein the first control circuit is configured to supply the first voltage regulator a second value of the regulator control signal to cause the first voltage regulator to supply as the supply voltage to the plurality of storage elements a second voltage during a first portion of a capture portion of the scan test and the first control circuit is configured to supply the first voltage regulator a third value of the regulator control signal to cause the first voltage regulator to supply as the supply voltage a third voltage during a second portion of the capture portion of the scan test; and
a plurality of clock domains and wherein the first control circuit is configured to control the supply voltage on a cycle by cycle basis for a selected one of the clock domains during the capture portion of the scan test.

6. The integrated circuit as recited in claim 1, wherein the integrated circuit further comprises:
first storage elements initialized during the shift portion of the scan test to store digital values corresponding to the first, second, and third values of the regulator control signal.

7. The integrated circuit as recited in claim 1, wherein the first control circuit comprises:
a first selector circuit coupled to supply a first control signal corresponding to the first value of the regulator control signal to the first voltage regulator when a scan enable signal is asserted and to supply an output of a second selector circuit when the scan enable signal is deasserted; and
the second selector circuit is coupled to select between at least a second control signal corresponding to the second value of the regulator control signal and a third control signal corresponding to the third value of the regulator control signal and to supply a selected signal as the output of the second selector circuit to the first selector circuit.

8. The integrated circuit as recited in claim 7, wherein the integrated circuit further comprises:
first storage elements initialized during the shift portion of the scan test to store select signals for the second selector circuit to cause the second selector circuit to select a desired pattern of the second and third values of the regulator control signal.

9. The integrated circuit as recited in claim 7, wherein the integrated circuit further comprises:
a plurality of voltage domains and a corresponding plurality of voltage regulators, including the first voltage regulator; and
a plurality of control circuits for respective ones of the plurality of voltage regulators, the plurality of control circuits including the first control circuit.

10. A method comprising:
configuring a plurality of storage elements into one or more scan chains;
supplying the storage elements a first voltage from a voltage regulator as a supply voltage during a shift portion of a scan test;
supplying the storage elements a second voltage from the voltage regulator as the supply voltage during a first portion of a capture portion of the scan test with the storage elements configured in a functional mode; and
controlling the voltage regulator on a cycle-by-cycle basis for a selected one of a plurality of clock signals during the capture portion of the scan test, the controlling including causing the second voltage to be supplied, the selected one of the plurality of clock signals being supplied to at least some of the storage elements during the capture portion of the scan test.

11. A method comprising:
configuring a plurality of storage elements into one or more scan chains;
supplying the storage elements a first voltage from a voltage regulator as a supply voltage during a shift portion of a scan test;
supplying a first functional clock signal to a first plurality of the plurality of storage elements during a capture portion of the scan test with the storage elements configured in a functional mode; and
controlling the voltage regulator to supply to the plurality of storage elements a cycle-by-cycle variable supply voltage as the supply voltage, variable on a cycle-by-cycle basis for each cycle of the first functional clock signal during the capture portion of the scan test.

12. The method as recited in claim 11, further comprising:
supplying a second voltage as the supply voltage during a first cycle of the first functional clock signal during a first portion of the capture portion of the scan test; and
supplying a third voltage as the supply voltage during another cycle of the first functional clock signal during a second portion of the capture portion of the scan test.

13. The method as recited in claim 12, wherein the first voltage is a higher voltage than the second voltage and the third voltage.

14. The method as recited in claim 13, further comprising:
selecting as an output of a first selector circuit a first control signal corresponding to the first voltage when a scan enable signal is asserted indicating the shift portion of the scan test and selecting as the output of the first selector circuit an output of a second selector circuit when the scan enable signal is deasserted indicating the capture portion; and
selecting in a second selector circuit one of at least a second control signal corresponding to the second voltage and a third control signal corresponding to the third voltage as the output of the second selector circuit.

15. The method as recited in claim 14, further comprising:
storing in a first plurality of storage elements digital values corresponding to the first control signal, the second control signal, and the third control signal.

16. The method as recited in claim 14, further comprising:
initializing a first plurality of the plurality of storage elements during the shift portion of the scan test to store signals for the second selector circuit selecting a desired voltage pattern for the voltage regulator to supply during the capture portion of the scan test.

17. A method comprising:
configuring a plurality of storage elements into one or more scan chains;
supplying the storage elements a first voltage from a voltage regulator as a supply voltage during a shift portion of a scan test;

supplying the storage elements a second voltage from the voltage regulator as the supply voltage during a first portion of a capture portion of the scan test with the storage elements configured in a functional mode;

supplying the storage elements a third voltage from the voltage regulator as the supply voltage during a second portion of the capture portion of the scan test with the storage elements configured in the functional mode;

supplying a first plurality of the storage elements with a first clock signal with a first frequency during the first portion of the capture portion of the scan test; and supplying a second plurality of the storage elements with a second clock signal with a second frequency during the first portion of the capture portion of the scan test.

18. The method as recited in claim 17 wherein the first voltage is greater than the second voltage and the third voltage.

\* \* \* \* \*